(12) United States Patent
Aswad

(10) Patent No.: US 6,408,537 B1
(45) Date of Patent: Jun. 25, 2002

(54) SUBSTRATE COOLING SYSTEM

(75) Inventor: Thomas W. Aswad, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/583,059

(22) Filed: May 30, 2000

Related U.S. Application Data

(63) Continuation of application No. 09/110,544, filed on Jul. 6, 1998.
(60) Provisional application No. 60/052,263, filed on Jul. 11, 1997.

(51) Int. Cl.[7] .............................. F26B 3/00; B65G 49/07
(52) U.S. Cl. ............................ 34/380; 34/329; 34/428; 34/461; 34/430; 34/433; 34/62; 34/393; 414/935
(58) Field of Search .......................... 34/329, 366, 367, 34/428, 60, 62, 444, 448, 461, 463, 430, 451, 433, 380, 381, 391, 393; 118/715, 724, 725, 729; 414/737, 752, 744.6, 744.8, 935

(56) References Cited

U.S. PATENT DOCUMENTS

| | | | |
|---|---|---|---|
| 3,322,577 A | | 5/1967 | Smith, Jr. |
| 3,656,454 A | | 4/1972 | Schrader |
| 4,458,427 A | | 7/1984 | Akerat |
| 4,566,726 A | | 1/1986 | Correnti et al. |
| 4,680,061 A | * | 7/1987 | Lamont ............... 148/1.5 |
| 4,717,645 A | | 1/1988 | Kato et al. |
| 4,811,493 A | | 3/1989 | Burgio, Jr. |
| 4,863,547 A | | 9/1989 | Shidahara et al. |
| 4,868,996 A | | 9/1989 | Ohmori et al. |
| 4,949,783 A | | 8/1990 | Lakios et al. |
| 4,951,601 A | * | 8/1990 | Maydan et al. ............ 118/719 |
| 5,033,407 A | | 7/1991 | Mizuno et al. |
| 5,080,549 A | | 1/1992 | Goodwin et al. |
| 5,133,635 A | * | 7/1992 | Malin et al. ............ 414/744.8 |
| 5,181,556 A | | 1/1993 | Hughes |
| 5,248,370 A | | 9/1993 | Tsui et al. |
| 5,259,883 A | | 11/1993 | Yamabe et al. |
| 5,318,801 A | | 6/1994 | Snail et al. |
| 5,345,999 A | * | 9/1994 | Hosokowa ................ 165/80.2 |
| 5,372,648 A | | 12/1994 | Yamamoto et al. |
| 5,443,997 A | | 8/1995 | Tsui et al. |
| 5,447,409 A | | 9/1995 | Grunes et al. |
| 5,447,431 A | | 9/1995 | Muka |

(List continued on next page.)

FOREIGN PATENT DOCUMENTS

| | | |
|---|---|---|
| JP | 62282437 | 12/1987 |
| JP | 03138369 | 6/1991 |
| JP | 03224236 | 10/1991 |
| JP | 04176121 | 6/1992 |
| JP | 04 176 121 | 6/1992 |
| JP | 07045536 | 2/1995 |
| WO | WO 93/26038 | 12/1993 |
| WO | WO 94/14185 | 6/1994 |

Primary Examiner—Ira S. Lazarus
Assistant Examiner—K. B. Rinehart
(74) Attorney, Agent, or Firm—Knobbe, Martens, Olson & Bear LLP

(57) ABSTRACT

A method and apparatus is disclosed for staging or cooling a substrate between high temperature thermal processing steps. In the disclosed embodiment, one or more cooling stations are located off-line within a wafer handling chamber, outside the thermal processing chamber. After thermal processing, a hot wafer can be loaded on to one station, where the wafer is subjected to forced convection cooling. In particular, the wafer is subjected to cooling gas from above and below through perforated upper and lower showerhead assemblies. The wafer can thus be cooled rapidly on a station while other wafers are transferred into and out of the processing chamber, Desirably, the wafer is cooled on the station to a point at which it can be handled by a low temperature wafer handler and stored in a low temperature cassette.

17 Claims, 9 Drawing Sheets

U.S. PATENT DOCUMENTS

| | | | |
|---|---|---|---|
| 5,494,529 A | | 2/1996 | Ciccarelli et al. |
| 5,516,732 A | * | 5/1996 | Flegal ........................ 437/250 |
| 5,520,538 A | | 5/1996 | Muka |
| 5,520,742 A | | 5/1996 | Ohkase |
| 5,552,017 A | * | 9/1996 | Jang et al. ............... 156/643.1 |
| 5,607,009 A | | 3/1997 | Turner et al. |
| 5,628,121 A | | 5/1997 | Brooks et al. |
| 5,778,968 A | | 7/1998 | Hendrickson et al. |
| 5,855,681 A | | 1/1999 | Maydan et al. |
| 5,882,413 A | | 3/1999 | Beaulieu et al. |
| 5,893,950 A | | 4/1999 | Martinoni et al. |
| 5,937,541 A | | 8/1999 | Weigand et al. |
| 5,951,770 A | * | 9/1999 | Perlov et al. ................ 118/719 |
| 5,970,717 A | | 10/1999 | Tateyama |
| 5,974,682 A | | 11/1999 | Akimoto |
| 5,975,740 A | * | 11/1999 | Lin et al. ............... 364/468.05 |
| 6,000,227 A | | 12/1999 | Kroeker |
| 6,066,210 A | * | 5/2000 | Yonemitsu et al. ......... 118/719 |
| 6,073,366 A | | 6/2000 | Aswad |
| 6,219,936 B1 | * | 4/2001 | Kedo et al. .................... 34/381 |

* cited by examiner

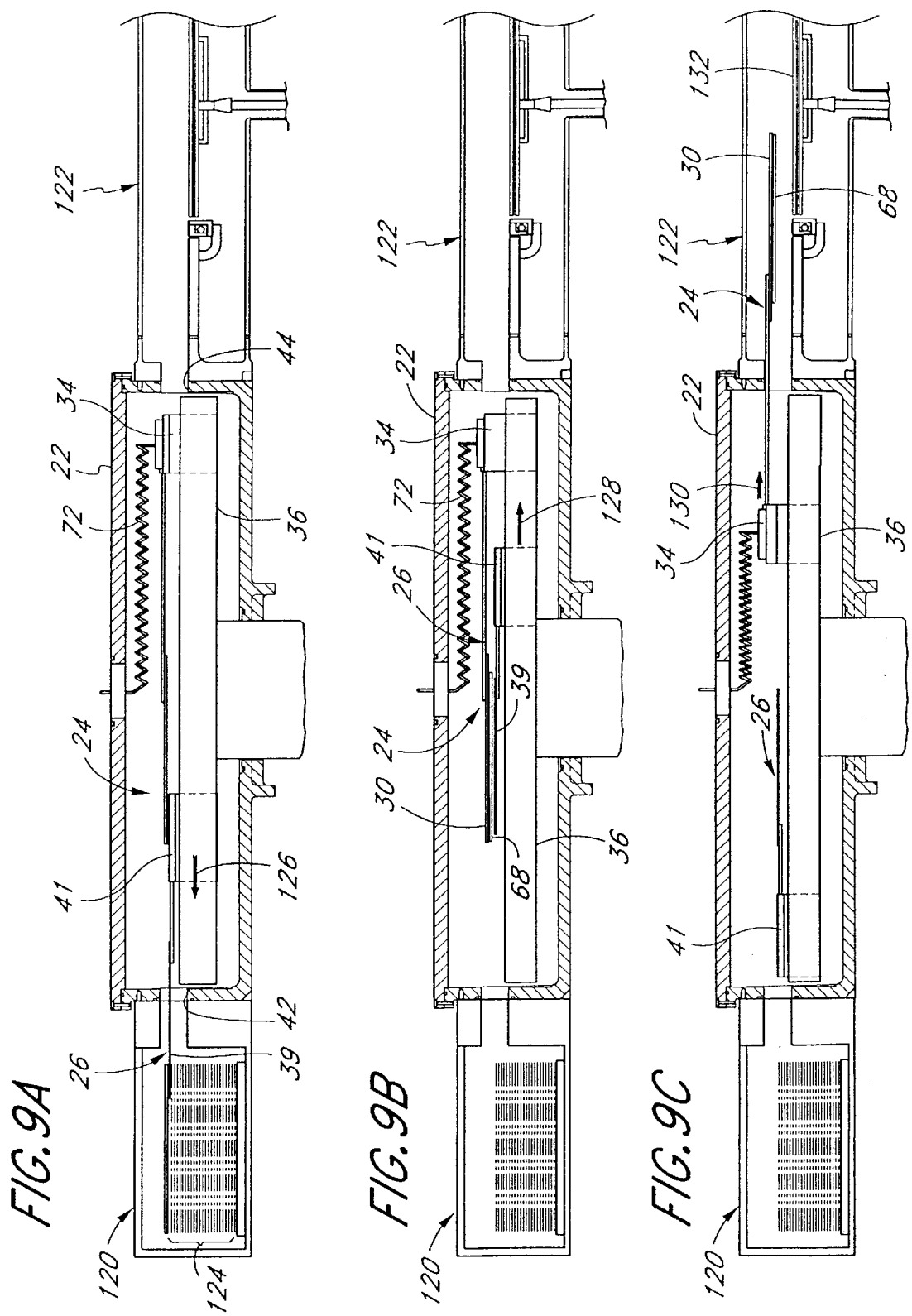

SUBSTRATE COOLING SYSTEM

REFERENCE TO RELATED APPLICATION

The present application is a continuation of U.S. application Ser. No. 09/110,544, filed Jul. 6, 1998, which claims the priority benefit of provisional Application No. 60/052,263, filed Jul. 11, 1997.

FIELD OF THE INVENTION

This invention relates to an apparatus and a method for cooling a wafer-like substrate in a substrate treating system. More particularly, the invention relates to cooling of a substrate by convection in a location not in the direct path of the treating system.

BACKGROUND OF THE INVENTION

Semiconductor wafers or other such substrates are subjected to very high processing temperatures. For example, in chemical vapor deposition (CVD), the temperatures approach 1200° C. In a typical cycle, a wafer is transferred from a room temperature cassette by a robotic wafer handler into a reactor chamber where it is subjected to the high temperature processing and is then transferred by the wafer handler from the high temperature chamber back to the same cassette or a separate cassette for processed wafers. Because of the high temperature CVD processing, transport from the process chamber directly to a wafer cassette is not possible due to the temperature of the wafer exceeding the material properties of most commonly used cassette materials. Because of this, the transfer of the wafer to a cassette must be postponed until the wafer temperature falls below the thermal properties of the cassette material. While cassettes are available that can handle wafers as hot as 170° C., they are relatively expensive. A commonly available less expensive one made of Delrin® can only handle temperatures well below 100° C. Other commonly available units can only handle about 60° C. Hence, it is a desirable goal that the temperature of a wafer be quickly cooled to that level.

Because the wafer handling and processing occurs in an enclosed and carefully controlled environment, there are essentially only three locations or points during the cycle where the cooling of the wafer might occur. The wafer could be cooled on the susceptor on which it is supported in the process chamber, on the wafer handling device, or off-line at some location within the apparatus. Cooling the wafer on the susceptor is not cost-effective because the process chamber is then unavailable for processing another wafer, thereby reducing the system wafer throughput. This approach is particularly unattractive because it is then necessary to incur the delay and cost of reheating the chamber. Removing a wafer while it is hot and cooling it on the wafer handling device is better, but also not cost effective because the delay in loading the next wafer slated for processing compromises throughput. Such impediments increase the per-wafer cost, making these approaches financially unattractive to end users. Because of the high cost of semiconductor wafer processing equipment, it is, of course, critically important from a competitive standpoint to be able to keep the expensive equipment in continued use so as to increase the throughput. At the same time, the wafer cooling technique employed must be compatible with the environment of the CVD processing apparatus so as not to adversely affect stringent cleanliness requirements. Also, the cost of the technique must itself be sufficiently moderate so that there is a net reduction in the per-wafer cost.

Accordingly, it is an object of this invention to provide an improved system for quickly cooling wafer-like substrates to a temperature that will allow the use of low cost commonly available cassettes.

SUMMARY OF THE INVENTION

In accordance with the invention, a substitute or cooling station is provided in a wafer handling chamber located between a wafer input/output storage area and a wafer process chamber. The cooling station is located so that the wafer handling device may be utilized while a wafer is cooling to transfer another wafer from storage into a process chamber and to transfer a cooled wafer into storage while the wafer is being processed.

In a preferred form of the apparatus and method, a processed wafer is withdrawn from the process chamber at a high temperature and placed by the wafer handler into a cooling station where it is sprayed by gas which is compatible with the gases being utilized in the wafer handling chamber. Preferably, the gas is sprayed onto both flat surfaces of the wafer by an upper showerhead and by a lower showerhead. While that wafer is being cooled, the wafer handler is operated to transport a second wafer into the process chamber.

It is desirable that a second cooling station be provided on the opposite side of the wafer handling chamber from the first one so that a second wafer may be moved from the wafer storage area into the second cooling station. Thus, as soon as the first wafer is transferred from the process chamber into the first cooling station, the wafer handler may move directly to the second cooling station and move that second wafer into the process chamber. In such an arrangement, the second cooling station is, in effect, serving as a staging area so that the time for moving the second wafer into the process chamber is reduced from what it would be if the wafer handler had to move the second wafer from the wafer storage area into the process chamber. Alternatively, if it is necessary to have a wafer cooling in each station at the same time, a wafer may be transported directly from the storage area to the process chamber.

In a preferred form of the invention, the wafer handler includes a Bernoulli wand which is particularly well adapted for moving a wafer into and out of a process chamber, and further includes a paddle, particularly well adapted for moving a wafer into and out of a common cassette for wafers. It is advantageous to be able to use the high temperature wand because it does not touch the upper surface of the wafer and it cools as it carries. Further, using the paddle for transporting a wafer between the cassette and the cooling station is desirable because it fits between wafers in a standard cassette.

Another advantage of the system of propelling gas against the surfaces of a wafer in a cooling station is that the rate of cooling may be easily controlled by the rate at which the cooling gas is projected onto the wafer. Thus, the flow rate can be adjusted to minimize the overall cycle time. The overall system provides a significant reduction in the wafer processing time and, consequently, reduces the cost per wafer. Further, this advantage is obtained without adverse effect on the clean environment required in CVD apparatus.

BRIEF DESCRIPTION OF THE DRAWINGS

FIGS. 9a, 9b and 9c are side cross-sectional, somewhat schematic views of a variation of wafer handles of FIGS. 6.

DETAILED DESCRIPTION OF A PREFERRED EMBODIMENT

Figure 1:
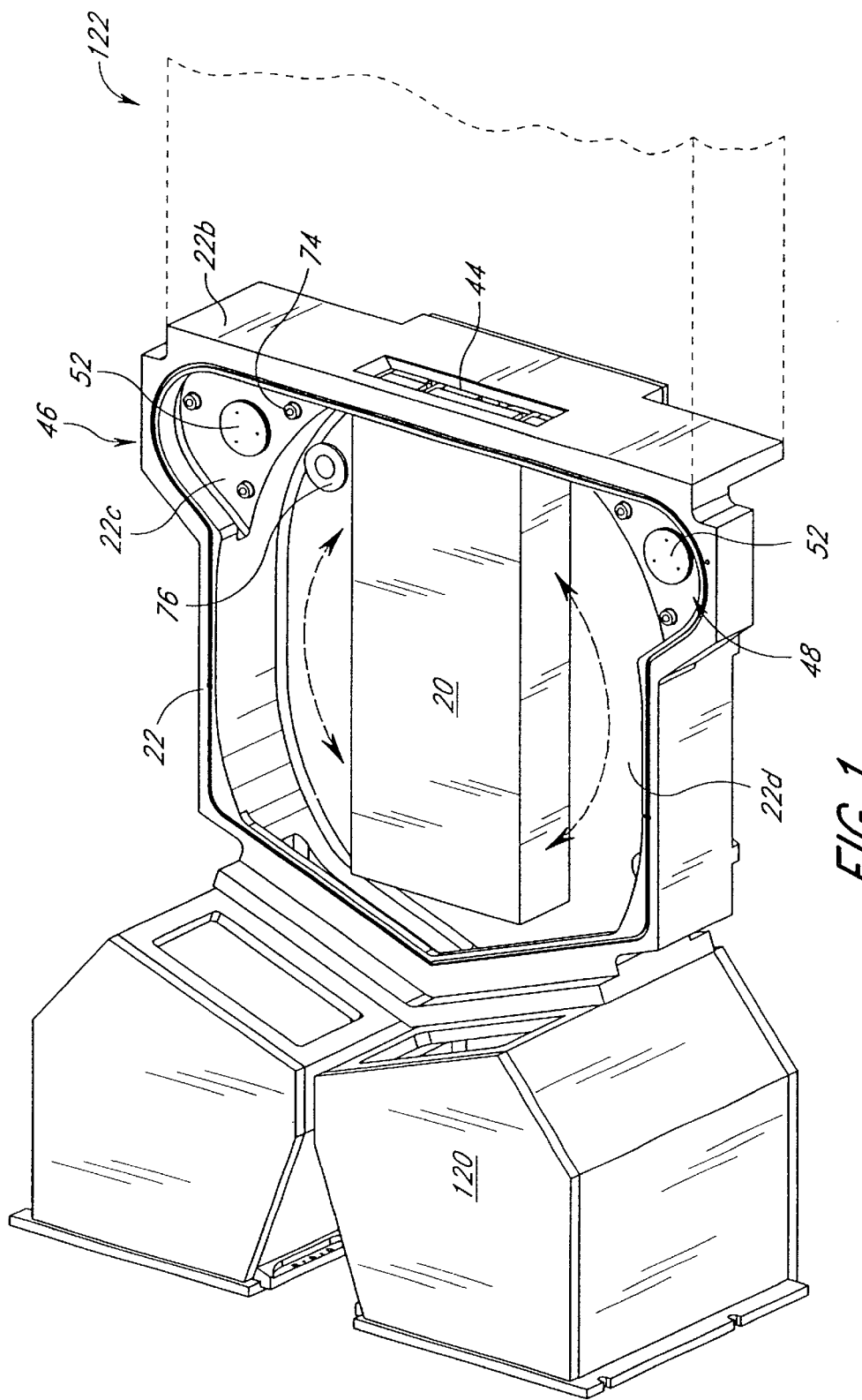
FIG. 1 is a perspective, somewhat schematic view of a wafer handling station and adjacent portions of a CVD apparatus.
Figure 2:
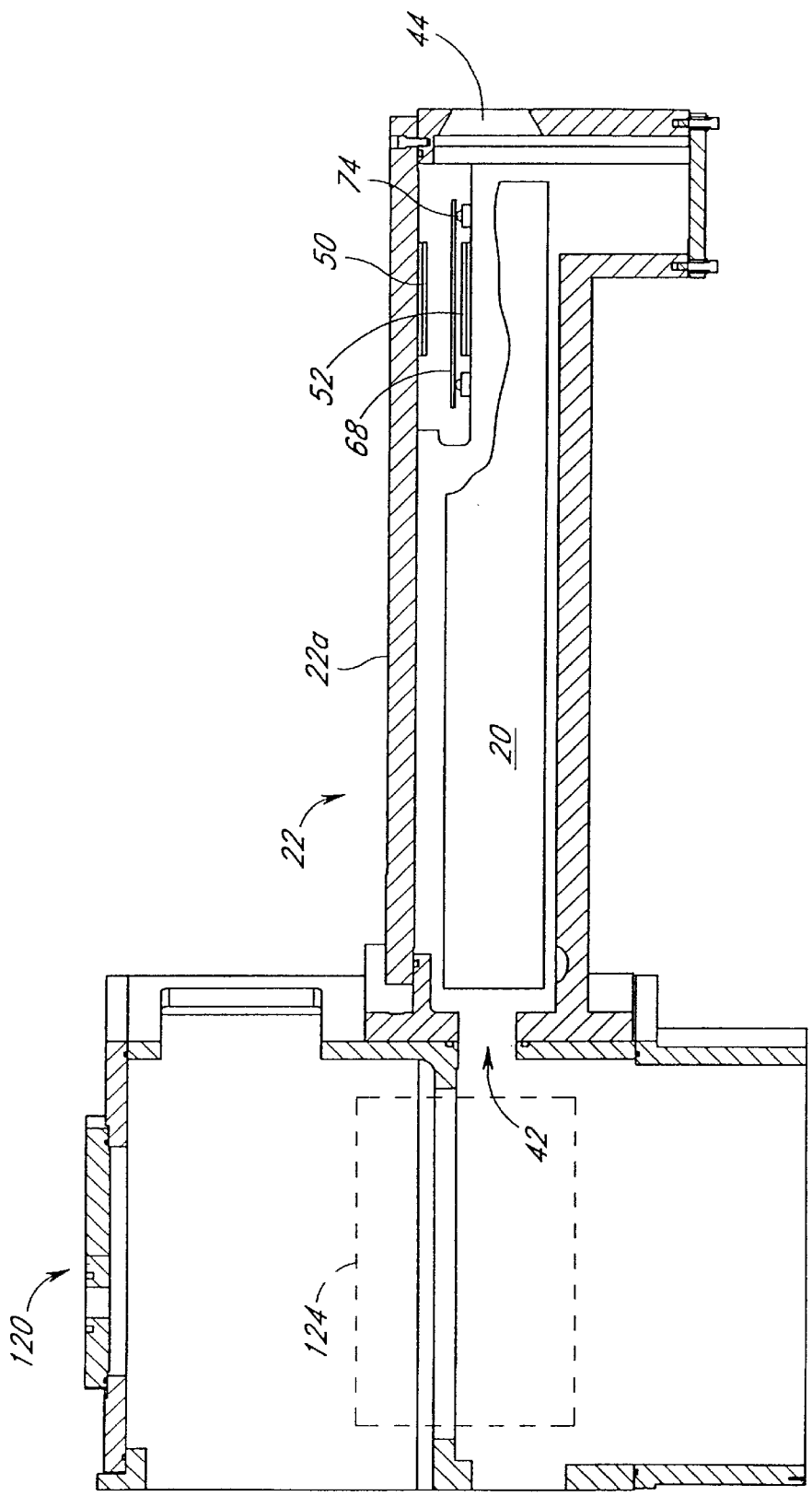
FIG. 2 is a cross-sectional view of the wafer handling chamber and wafer input or output chambers.

Referring to FIGS. 1 and 2, there is illustrated a portion of a chemical vapor deposition apparatus, including a schematically illustrated automatic or robotic wafer handler 20 centrally positioned within a handling chamber 22. The chamber upper wall 22a is schematically shown in FIG. 2, but is not shown in FIG. 1 so as to illustrate internal components in the chamber. The handling chamber is connected to load/unload chambers 120 by way of a load/unload port 42. FIG. 1 illustrates a separate load chamber and a separate unload chamber. FIG. 2 shows a single one of those chambers. Many systems utilize a single chamber from which a wafer is withdrawn for processing and is then returned after processing. Either may be referred to as a storage area. The handling chamber 22 is further connected to a processing chamber 122, schematically illustrated in. FIG. 1, by way of a processing port 44 through a sidewall 22b of the handling chamber. Gates or valves are normally provided for the load/unload port and the processing port, but these are not shown for purposes of simplicity.

In accordance with the invention, there is provided a wafer cooling station 46 in one portion of the wafer handling chamber 22 adjacent the process chamber 122. Further, a second cooling station 48 is located on the other side of the wafer handling chamber adjacent the wall leading to the process chamber. Each cooling station is sized to receive in a horizontal position one wafer, and the cooling station is open to the area of the handling chamber in which the wafer handler is positioned so that wafers may moved into and out of the cooling stations by the handler.

Figure 3:
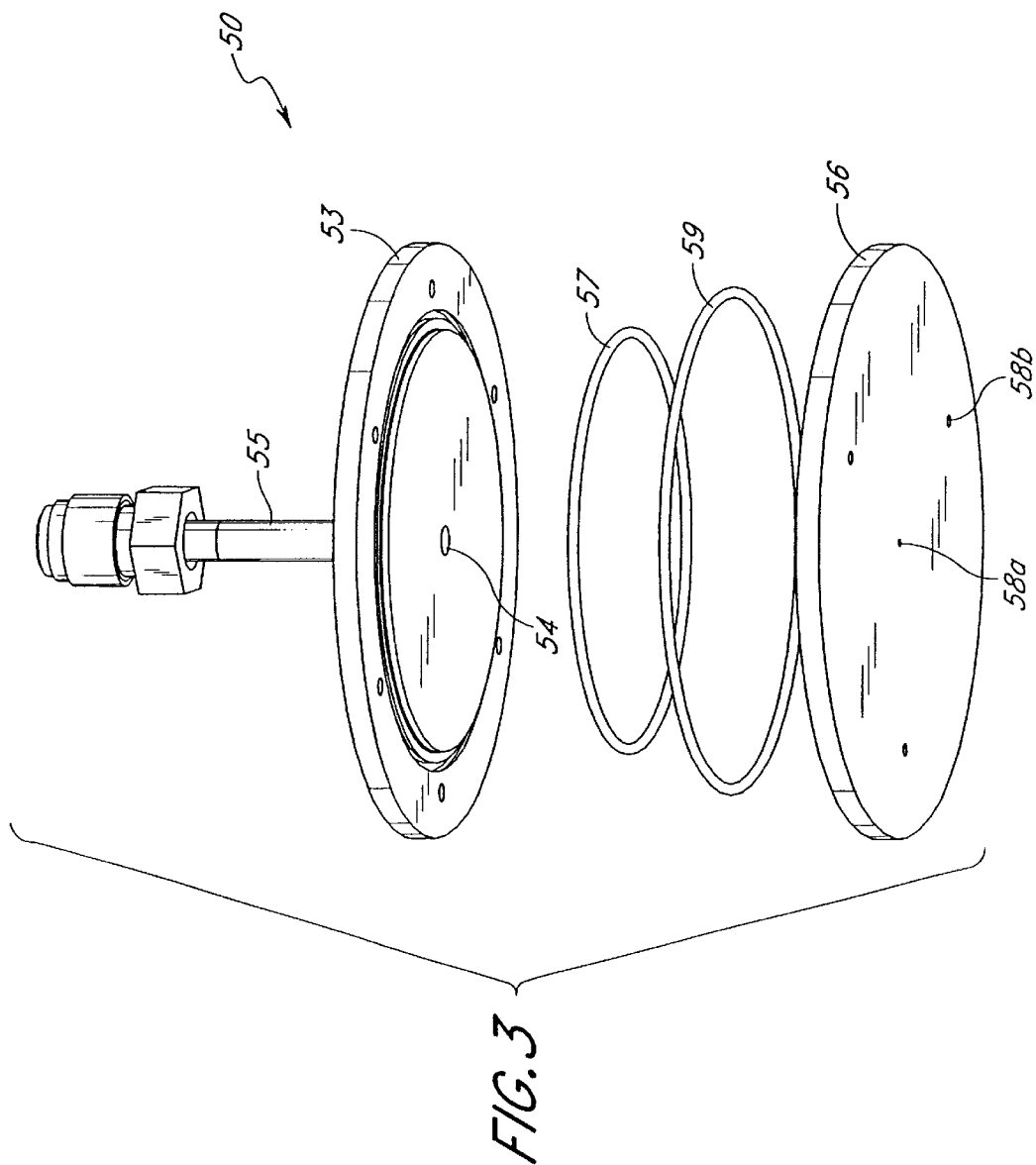
FIG. 3 is an exploded perspective view of an upper showerhead of the cooling station of the invention.

Each cooling station includes an upper showerhead assembly 50 spaced above a lower showerhead assembly 52, as seen in FIGS. 1 and 2. Referring to FIG. 3, the upper showerhead assembly includes a disc-shaped base 53 having a centrally located gas inlet 54 which is connected to an inlet conduit 55, which, in turn, is connected to a suitable source of gas (not shown). A disc-shaped showerhead 56 is clamped to the base with suitable fasteners (not shown). An O-ring 57 fits between the base and the head to form a flat circular manifold space. A second O-ring 59 fits between these components around a belt ring. There is a plurality of gas outlet holes formed in the showerhead, one hole 58a in the center and three others 58b equally spaced radially and circumferentially with respect to the center.

Figure 4:
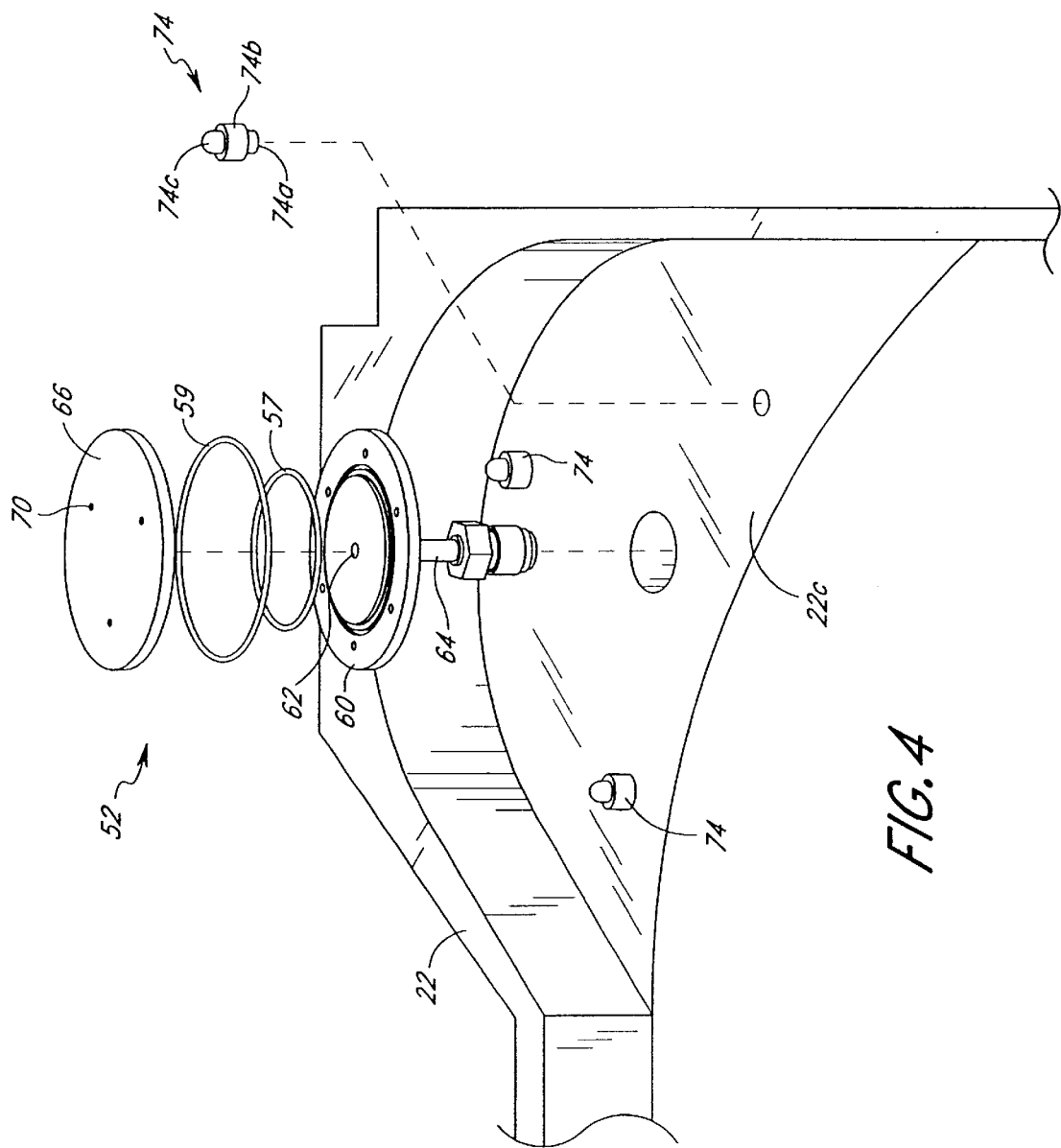
FIG. 4 is an exploded perspective view of a lower showerhead of the cooling station of the invention.

Referring to FIG. 4, it may be seen that the lower showerhead assembly 52 has a construction similar to that for the upper cooling station. This includes a lower showerhead base 60 having a centrally located gas inlet 62 connected to a conduit 64 which, in turn, is connected to the same gas source (not shown) as the upper showerhead assembly. A disc-shaped lower showerhead 66 is clamped to the lower showerhead base by suitable fasteners (not shown) with the O-rings clamped between the two components to seal a flat disc-shaped gas manifold formed between the lower base and showerhead. Three gas outlet holes 70 opening to the handling chamber are shown formed in the lower showerhead equally spaced radially and circumferentially from the gas inlet 62 in the lower base. The ring of holes is on a smaller diameter than that for the upper assembly 50 so that the holes 70 are radially offset from the holes 58b. Also, the holes 70 and 58b of the two assemblies are circumferentially offset so that these holes are spaced about 60°.

Additionally shown in FIG. 4, as well as in FIGS. 1 and 2, are three quartz pins 74 for supporting a wafer 68 positioned in the cooling station. Each pin includes a generally cylindrical base 74a that fits into a socket in a lower shelf 22c forming the cooling station floor with a larger cylindrical portion 74b engaging the shelf and with an upper tip 74c. The tip preferably has a rounded or hemispherical shape so as to have minimum contact with the wafer. The shelf is spaced upwardly from the bottom wall 22d of the handling chamber so that wafer lifting elements of the handler 20 will be suitably aligned with the cooling station.

Also shown in FIG. 1 as part of the cooling station control system is a sensor 76 mounted in the floor 22d of the handling chamber. The sensor is located below the area that an edge of wafer 68 in the cooling station 46 extends over the sensor so that the sensor can sense the presence or absence of a wafer in the cooling station.

Figure 5:
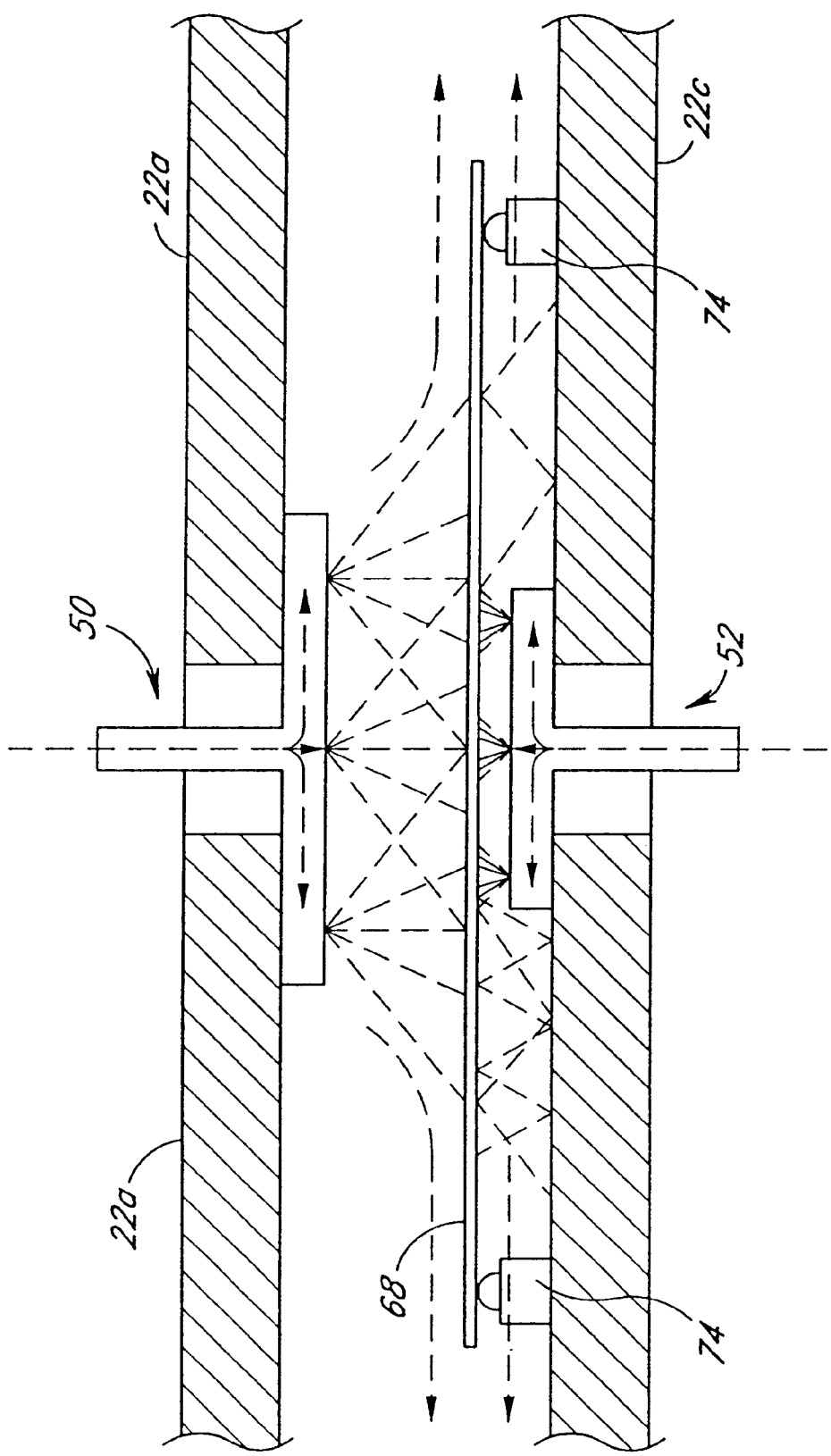
FIG. 5 is a schematic, cross-sectional view of the cooling station of the invention in operation.

FIG. 5 schematically illustrates the cooling station wherein it can be seen that the upper showerhead assembly 50 is located adjacent the upper wall 22a of the handling chamber and the lower showerhead assembly 52 is supported on the shelf 22c. The wafer 68 is shown positioned between the two showerhead assemblies on the wafer supports 74. As can be seen, the showerhead assemblies are smaller in diameter than the wafer so as not to extend over the sensor 76 and so as not to interfere with rotation of the handler 20. As indicated by the arrows, cooling gas is jetted downwardly onto the upper surface of the wafer and upwardly onto the lower surface of the wafer.

Figure 6:
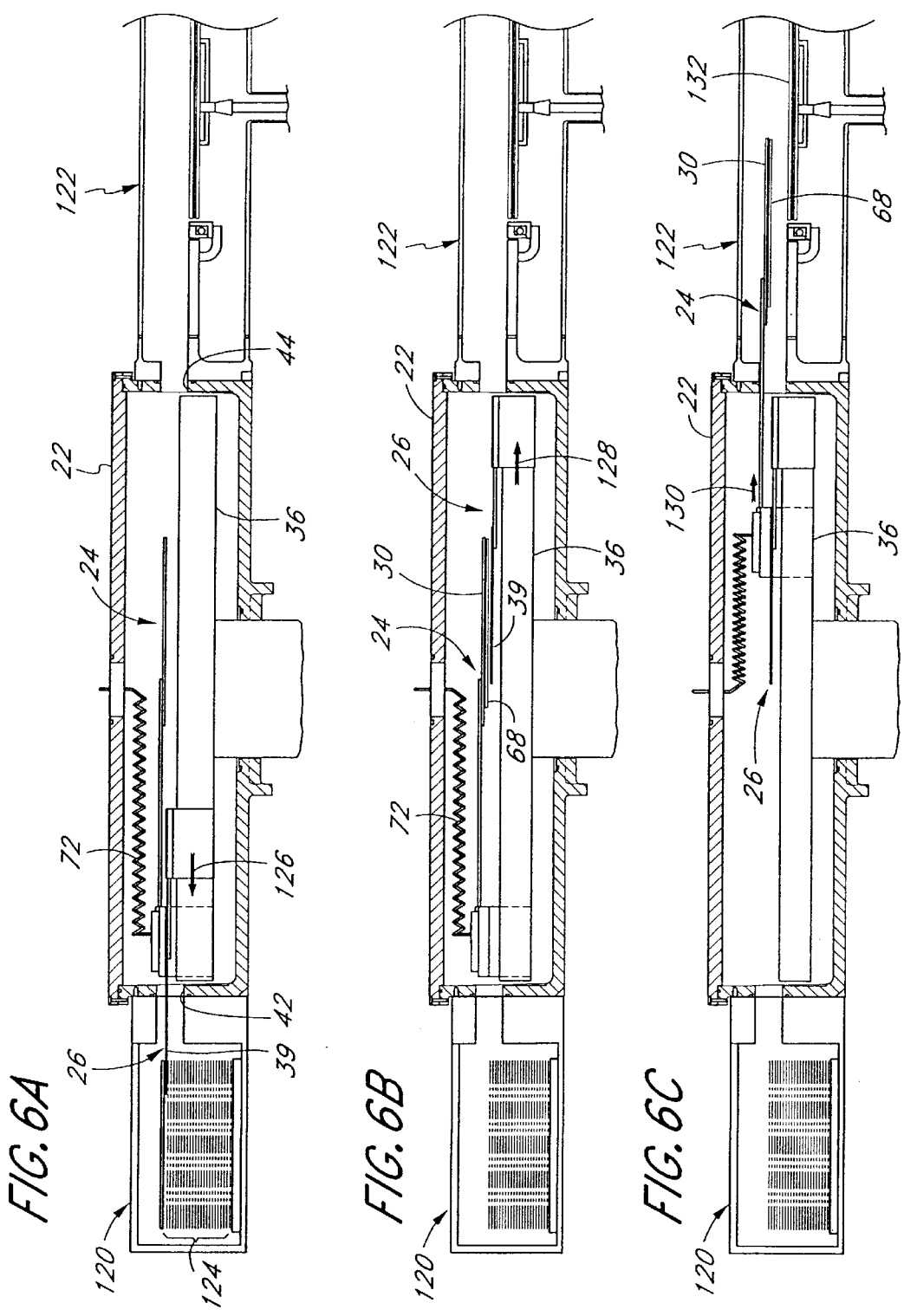
FIGS. 6a, 6b and 6c are side cross-sectional, somewhat schematic views of one form of a wafer handler which can be used with the cooling stations of the invention.

Referring to FIGS. 6a, 6b and 6c, there is schematically illustrated one form of a wafer handler 20. Various systems are known for handling wafers within semiconductor processing systems. One type of pick-up device is that known as a Bernoulli wand which utilizes jets of gas downward from the wand toward the wafer that then flow radially outward to create a region of lower pressure between the wafer and the wand, thereby lifting it. The Bernoulli wand advantageously avoids contact with the wafer, except, perhaps, at one or more small edge locators. One type of Bernoulli wand is shown in U.S. Pat. No. 5,080,549 to Goodwin, et al, which is incorporated herein by reference.

Another type of wafer pick-up wand utilizes a vacuum force and, thus, must be in intimate contact with the wafer. U.S. Pat. No. 4,566,726 to Corentti, et al. discusses a combination of Bernoulli and vacuum pick-up devices.

A third type of wafer pick-up device is a simple paddle which lifts and supports wafers from underneath. Such a paddle is illustrated in U.S. Pat. No. 4,951,601 to Maydan, et al. That patent also illustrates a typical movement device for translating wafers from location to location within processing systems. The wafer handler is capable of linear retraction and extension, as well as rotation about an axis.

U.S. Pat. No. 5,135,349 to Lorenz, et al., discloses a robotic handling system using two paddle-type pick-ups mounted on a common rotating base. Both pick-ups are adapted to extend linearly away from one another to speed handling of wafers within the processing system. The paddles are augmented with a vacuum generated through a plurality of holes in an end effector portion of each paddle; the vacuum being transmitted along a channel within the paddle.

While any of these various wafer handling systems can be modified or adapted for use: with the cooling station concept of the present invention, FIGS. 6a, 6b and 6c, disclose a desirable handler which provides both a Bernoulli wand and a paddle. A complete description of such an arrangement is disclosed in U.S. patent application Ser. No. 08/784,711 filed Jan. 16, 1997, which is incorporated herein by reference. The FIGS. illustrate a typical sequence of movement of pick-up arms 24 and 26 of the wafer handling assembly 20. As mentioned above, the handling chamber is attached to a load/unload chamber 120 on one end, and a. processing chamber 122 on an opposite end. The ports 42 and 44 on opposite ends of the handling chamber are aligned with similarly sized ports in the load and unload processing chambers 120 and 122, respectively. A cartridge or cassette 124 is positioned within the load/unload chamber 120, and is adjustable in a vertical direction to align a particular wafer with the port 42. A controlling computer (not shown) provides instructions to motors and pulleys (not shown) to cause the pick-up arms 24 and 26 to translate along a guideway 36.

In a first motion, as seen in FIG. 6a, the pick-up arm 26 translates toward the chamber 120 in a left direction, as indicated by the arrow 126. A paddle 39 extends through the port 42 and beneath a wafer in the cassette 124. As mentioned, the cassette may be vertically movable or the paddle 39 may be independently vertically movable to extend underneath, the wafer without contact therewith, and then undergo relative vertical motion to lift the wafer from the cassette.

In FIG. 6b, the arrow 128 indicates the movement of the pick-up arm 26 into a position which places the wafer 68 directly beneath the wand 30. Gas flow to the wand is then initiated through the extension hose 72 to enable transfer of the wafer 68 from the paddle 39 to the wand 30.

After the wafer 68 has been lifted by the Bernoulli wand 30, the pick-up arm 24 translates toward the chamber 122 to the right, as indicated by the arrow 130 in FIG. 6c, to insert the wand 30 and wafer 68 into the processing chamber 122. In the arrangement shown, the processing chamber 122 is suitable for CVD and includes a rotatable susceptor 132 upon which the wafer 68 is placed. By stopping the flow of gas through the extension hose 72 and Bernoulli wand 30, the wafer 68 is dropped on the susceptor 132.

An advantage of the use of a paddle and a Bernoulli wand is that the first end-effector, or paddle, has a sufficiently thin profile to fit between wafers in a standard cassette to remove or insert wafers therein. The second end-effector, or Bernoulli wand, is somewhat thicker than the paddle, such that it normally requires specially designed cassettes, which adds to the expense of a system. However, the Bernoulli wand is particularly well-suited for transferring wafers into and out of a process chamber since it can easily withstand high temperatures and does not physically touch the wafer, except along one edge by one or more stops that help locate or position the wafer.

The above description of a wafer handler is only showing linear motion between a wafer storage area and a process chamber. However, with a suitable motor and drive system (not shown), the entire wafer handler can be rotated about a vertical axis in either direction to provide rotational as well as linear motion. The details of the linear drive system are disclosed in the above-referenced pending patent application. Also, the details regarding a rotational system, as well as additional details regarding the linear one, are available from Cybeq Systems Inc. of Menlo Park, Calif. Other suitable drive arrangements are apparent to those with skill in this particular art and are described in the above-mentioned patents.

With a rotating wafer handler the pick-up arms 24 and 26 may be mounted to be moved in the same retracting and extending directions in the guideway 36. Such an alternative arrangement is shown in FIGS. 9a, 9b, and 9c. In FIG. 9a, the paddle pick-up-arm 26 is shown having moved to the left to pick-up a wafer, as in FIG. 6a. The arm 24 however is shown in FIGS. 9a and 9b with its carrier 34 located on the right side of the handler. In FIG. 9b, the arm 26 has been retracted so that the paddle 39 and the wafer 68 are beneath the wand 30 so that the wafer can be transferred. The handler can then be rotated to be aligned with the process chamber. FIG. 9c shows the handler rotated with the carrier 34 having moved over the carrier 41, and the arm 24 extending the wafer into the process chamber.

The wafer handlers 20 described above are particularly useful with the cooling station of the invention because the Bernoulli wand can elevate and transport a wafer out of the process chamber while it is still hot. The wafer is, however, too hot to transfer directly to a load/unload chamber 120. Instead, the wafer handler is rotated a small distance so that the Bernoulli wand is aligned with one of the cooling stations. The Bernoulli wand is then extended to place the hot wafer onto the pins 74 in the cooling station 46.

While the first wafer is being cooled, a second wafer may be positioned into the process chamber. This second wafer may be retrieved from the cassette 124 by the paddle and transferred to the Bernoulli wand, or the second wafer may have been positioned into the second cooling station 48 while the first wafer was being processed. In that case, the handler only has to be rotated a short distance (about 100°) from the first cooling station 46 to align the wand with the second cooling station 48 to withdraw the second wafer, and then rotate back (about 50°) to the position where the second wafer can be inserted into the process chamber. The second cooling station 48 in that situation is serving as a staging area. After the second wafer has been placed into the process chamber, the first wafer can be removed from the first cooling station and returned to the storage area 120 assuming it has been adequately cooled by then. Immediately after placing a processed wafer into the storage area, a third wafer can be withdrawn from the cassette 124 and moved to one of the cooling/staging stations to await its turn to be placed in the process chamber. From the foregoing, it can be appreciated that great flexibility is provided in the handling of the wafers so that the wafers can be moved in various sequences to fit with the temperatures and times of the processes being used by the system and with the time required to cool the particular wafers to the temperature desired before. returning the wafer to the standard cassette.

Figure 7:
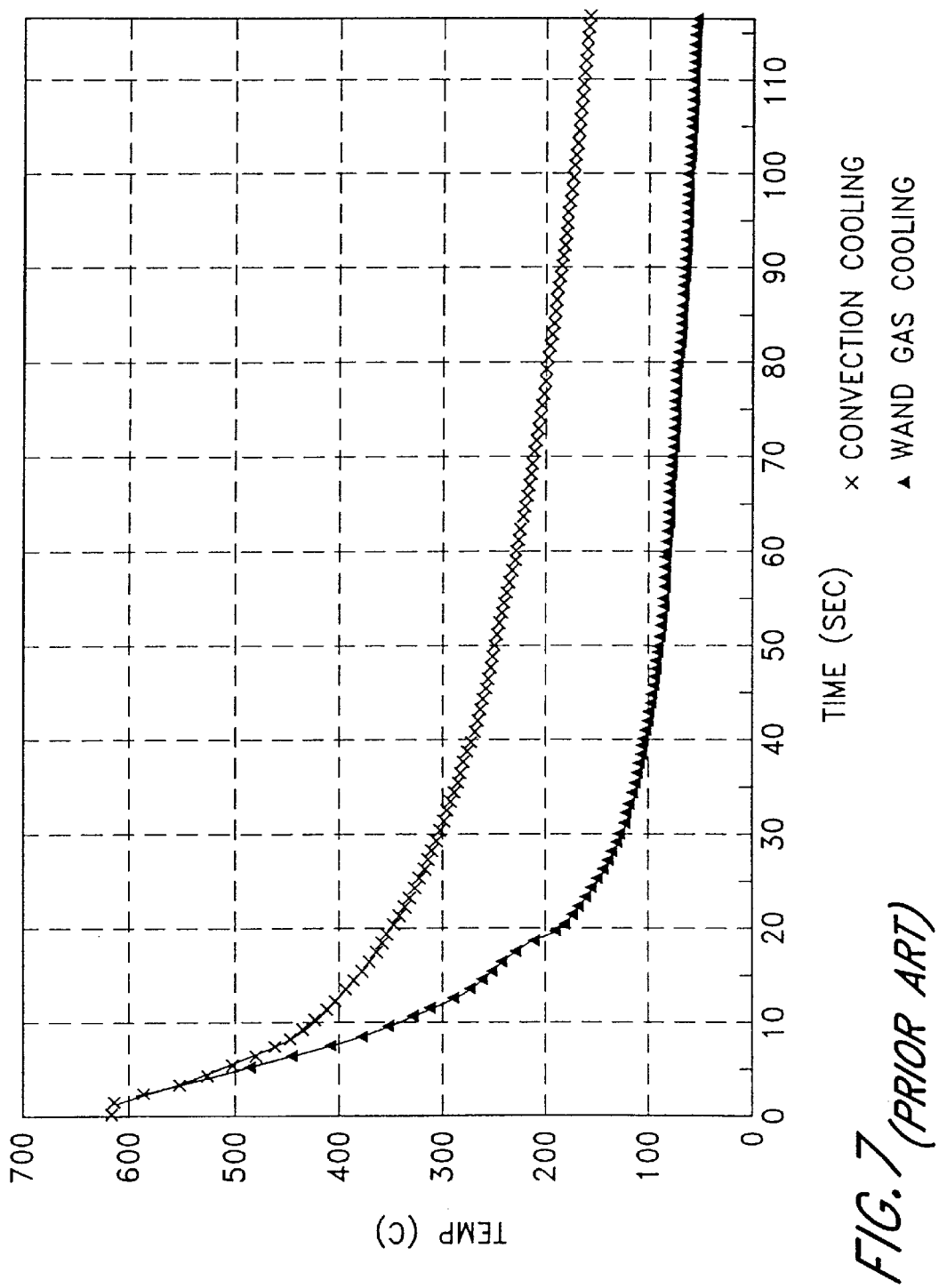
FIG. 7 is a graph indicating the rate at which a wafer is cooled by unassisted prior art convection cooling and by cooling while being supported by a pick-up wand utilizing gas for that purpose.
Figure 8:
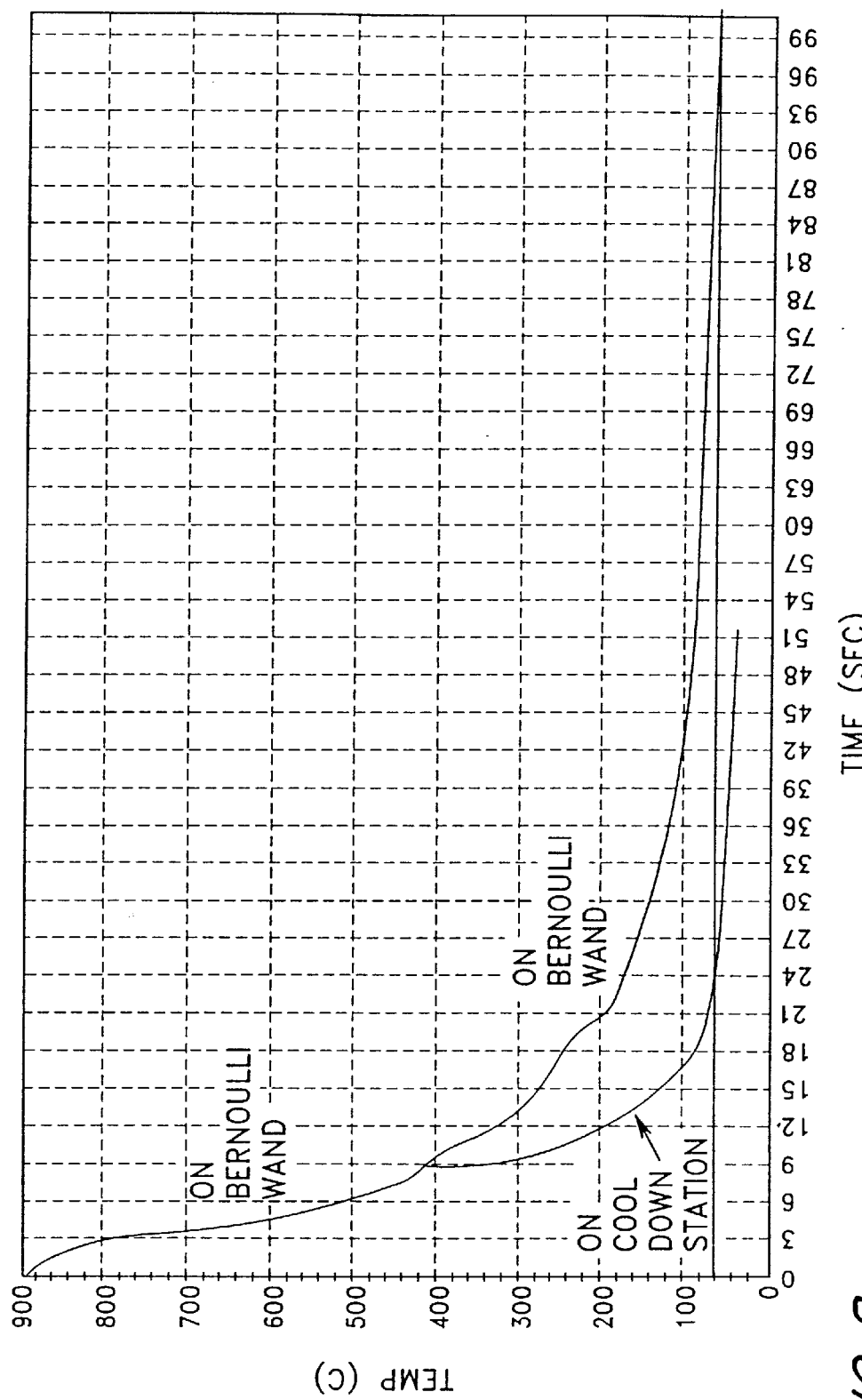
FIG. 8 is a graph illustrating the time to cool a wafer on a prior art pick-up wand in comparison to cooling in a cooling station of the invention.

Refer now to FIGS. 7 and 8 to gain a better appreciation for the cooling obtained from initial experimental uses of the invention. FIG. 7 in the upper line of the graph indicates a prior art cooling curve for a wafer that is simply cooled by convection without forced gas flow over the wafer surface other than slight purge gas flow through a chamber. As seen, a wafer which was at slightly more than 600° C. initially cools to a temperature of 400° C. in about 12 or 13 seconds. However, the temperature does not drop to 200° C. until about 80 seconds from the initial starting point. Further, even after close to 120 seconds the temperature is still. about 160° C., at which temperature it is still necessary to use an expensive cassette.

The lower curve in FIG. 7 indicates the condition in which a Bernoulli wand is utilized to lift a hot wafer and move it into the handling chamber with the wafer being cooled by the gas flowing out of the Bernoulli wand. This is the conventional prior art situation for handling a wafer with a Bernoulli wand. As may be seen, the temperature drops quickly to about 300° C. after about 12 seconds, which is much faster than the wafer simply cooled by convection without appreciable gas flow. Further, the temperature has dropped to 200° C. after about 20 seconds, and dropped to 100° C. after 40 seconds. It then takes almost an additional 60 seconds to lower the temperature to about the desired, 60° C. at which temperature it may be received in a commonly available relatively low-cost cassette. While the wafer is being cooled on the Bernoulli wand, neither it nor the process chamber can, of course, be utilized for another wafer. Further, while the wafer could be transferred from the wand to the paddle to save some handling time, it would then no longer be receiving the cooling gas expelled by the Bernoulli wand so that greater time would be required.

By contrast to the foregoing, refer to FIG. 8 which illustrates the greatly improved situation obtained from the cooling stations of the invention. The graph shows a hot wafer being removed from the chamber at a temperature of close to 900° C. by the use of the Bernoulli wand. The temperature has dropped to about 400° C. by the time the Bernoulli wand has been. retracted to the handling chamber, the wafer handler rotated to align the wand with a cooling station, and the wand extended to place the hot wafer in the cooling station. This takes approximately 9 seconds in the example illustrated and the temperature of the wafer has dropped by then from 900° C. to 400° C., which is consistent with the wand gas cooling of FIG. 7. The upper line continuing from that point, as shown on the graph of FIG. 8, shows the cooling if the wafer is simply left on the Bernoulli wand as described above in connection with FIG. 7. The lower curve in FIG. 8 shows the reduction in temperature of the. wafer placed in the cooling station. As can be seen,. the temperature of the wafer drops another 200° C. to about 100° C. after only 3 seconds in the cooling station. Further, the temperature is down to about 100° C. in another 5 or 6 seconds, only 17 or 18 seconds from the time the wafer is lifted by the Bernoulli wand in the process chamber. Further the wafer temperature has dropped to the 60° C. level after approximately 24 seconds from the beginning. This is in contrast to the temperature not dropping to that level remaining on the Bernoulli wand until after over 100 seconds from the beginning, and much longer if only on a paddle. Thus, it can be seen that there is a very dramatic reduction in the time required to adequately cool the wafer before it can be placed in the low-cost cassette.

In addition, as explained above, the wafer handler is available to place a second wafer, into the chamber as soon as the first wafer has been placed into the cooling station, which in the example indicated by the graphs in FIG. 8, would be after about 9 seconds from the time the wafer has been lifted in the process chamber. If a second wafer has been placed into the second cooling station utilizing it as a staging area while the first wafer is being processed, the wafer handler only has to rotate to be aligned with the second cooling station so as to allow the Bernoulli wand to lift and place a second wafer in the process chamber. When the first wafer has been adequately cooled, the wafer handler may be rotated so that the paddle is aligned with the cooling station to withdraw the cooled wafer. The wafer handler can then be rotated so that the paddle 26 is aligned with the cassette and the paddle is utilized to place the cooled wafer into the cassette.

The time to pick-up a hot wafer, take it to the cooling station, pick-up a second wafer from the staging station and place it in the process chamber, retract the wand, and close the process chamber gate is about 33 seconds. The time required under the old system for that sequence was about double that, not counting cooling time. That is the time savings simply by having the cooling stations for staging. Further, it would take about another 45 seconds under the old system to cool the wafer to be able to place it in a low cost cassette.

Further details regarding the structure and operation of the cooling stations will enable a better understanding and appreciation of the invention. In a prototype of the system, the central hole 58a of the upper showerhead has a diameter of about 0.016 inch, and the surrounding three holes each has a diameter of about 0.026 inch. The three holes 70 in the lower showerhead has a diameter of about 0.028 inch. These holes are designed to produce a flow rate of about 20 liters of nitrogen per minute at a pressure of 20 psi from each showerhead. That is, both the upper surface and lower surface of the wafer receives gas at the rate of about 20 liters per minute.

The outlet holes in the showerheads that are spaced outwardly from the center are about 120 degrees apart. Preferably, the outlets from one of the showerheads are staggered with respect to the other, so that as a total, there is a gas outlet about every 60 degrees. The upper holes are on a ring having a larger diameter than the lower ring. Hence, the holes are also radially offset. This arrangement provides a more even dispersion of the gas flow.

The cooling gas employed is conveniently the same gas utilized for the Bernoulli wand, typically nitrogen or hydrogen. Hence, it can come from the same source. Further, after cooling gas flows across the wafer, it simply flows into the handling chamber and is withdrawn from the handling chamber by the same system normally employed in a handling chamber connection utilizing a Bernoulli wand.

Advantageously, the cooling time can be simply controlled by the gas flow rate. The object, as indicated above, is to get the temperature of the wafer down to about 60° C. before the robot paddle is utilized to pick up the wafer and transfer it to the low-cost cassette in the storage area. The time required to cool an 8 inch wafer with a flow rate of 20 liters per minute from each of the showerheads was about 20 seconds in a experimental system. Doubling the flow rate to about 40 liters per minute out of both showerheads reduced the cooling time down to about 12 seconds. Flowing cooling gas only through the top showerhead cooled the wafer to the desired level in about 35 seconds.

The distance between the plane defined by the tops of the three support pins and the upper showerhead can be slightly greater than the distance between that plane and the lower head because the wand is slightly thicker than the paddle. Spacing and gas flow may, of course, be varied to fit the given situation. In a prototype, the distance between the showerheads was about 1.125 inch, with the spacing from the wafer to the lower showerhead being only about 0.2 inch.

Based on the foregoing, it will be appreciated that the substrate cooling system of the invention has great flexibility such that many of the substrate handling sequences can be varied to fit a particular process cycle, with the main concept being that the process chamber can be placed into use with a second substrate while a first one is being cooled. While a particular type of wafer handler has been described, a variety of wafer handlers may be employed. Likewise, while a particular cooling station has been described, various other cooling stations may be employed. Although gas is utilized to cool the wafer, possibly other cooling mechanisms may be employed. While the invention is useful with a single cooling station, two cooling stations provide additional flexibility, and it is possible that an additional cooling station could be provided if desired. While a single process chamber has been illustrated and discussed, a so-called cluster system could be employed wherein additional process chambers may be clustered around the wafer handler. With the arrangement shown at least two additional chambers could be provided. Other variations of the invention may also be contemplated and, hence, it is intended that the scope of the invention not be limited to that illustrated.

What is claimed is:

1. A method of cooling semiconductor substrates subjected to high temperatures comprising:

withdrawing a hot substrate from a process chamber;

positioning the hot substrate on a support between two opposing showerheads;

spraying inert coolant from the showerheads onto opposite sides of the substrate; and removing the substrate from the support to a storage area.

2. A method of cooling substrates that have been subjected to high temperature semiconductor processing, comprising:

providing a substrate handler in a handling chamber, the substrate handler capable of transporting substrates into and out of a high temperature process chamber;

withdrawing a first substrate from the process chamber with said substrate handler and transporting the first substrate into a cooling station within and open to the handling chamber; and inserting a second substrate into the process chamber with said handler while the first substrate is cooling in the cooling station.

3. A method of cooling a hot substrate that has been subjected to high temperatures in a chamber, comprising:

removing the hot substrate from the chamber with a substrate handler;

moving the handler and the hot substrate to a position between upper and lower showerheads;

depositing the substrate on spaced supports configured to position the substrate between and spaced from the showerheads;

withdrawing the handler from between the showerheads leaving the substrate on the supports; and spraying gaseous coolant from the showerheads onto generally flat upper and lower surfaces of the substrate.

4. The method of claim 3, wherein removing, moving, and depositing are performed with a Bernoulli wand which is positioned above the substrate and lifts the substrate without contacting said upper and lower surfaces of the substrate.

5. A method of cooling substrates that have been subjected to high temperature semiconductor processing, comprising:

providing a substrate handler in a handling chamber, the substrate handler capable of transporting substrates into and out of a high temperature process chamber;

withdrawing a first substrate from the process chamber with said substrate handler and transporting the first substrate into a cooling station within and open to the handling chamber;

inserting a second substrate into the process chamber with said handler while the first substrate is cooling in the cooling station, and removing the first substrate from the cooling station while the second substrate is processed within the process chamber.

6. The method of claim 5, further comprising retrieving a third substrate with said handler while the second substrate is processed within the process chamber.

7. The method of claim 5, further comprising:

withdrawing the second substrate from the process chamber with said substrate handler and transporting the second substrate into the cooling station; and inserting the third substrate into the process chamber with said handler while the second substrate is cooling in the cooling station.

8. The method of claim 7, wherein the third substrate is staged upon a station within the handling chamber while the second substrate is withdrawn.

9. An apparatus for cooling a semiconductor substrate comprising:

first and second showerheads spaced from each other and oriented towards each other so that fluid sprayed from the heads is sprayed towards each other; and a support for supporting said substrate between said showerheads, said support being configured to cause fluid from said showerhead to spray onto opposite flat sides of said substrate.

10. An apparatus for cooling a substrate after a high temperature processing comprising:

a substrate handling chamber having a port through which the substrate may be moved from the handling chamber into and out of a high temperature process chamber;

an automatic substrate handler in the handling chamber for transporting the substrate into and out of the process chamber; and a first cooling station in which a processed substrate may be moved by said handler to be cooled, said station being located in a section of the handling chamber out of the path of the handler movement to enable a second substrate to be placed in the process chamber while a first substrate is being cooled in the cooling station, wherein said first cooling station includes upper and lower gas showerheads spaced from each other, and including supports for supporting the substrate between the showerheads and spaced from the showerheads, each of said showerheads being adapted to be connected to a source of cooling gas to enable cooling gas to be projected through openings in said showerheads onto the upper and lower surface of the substrate to cool the substrate.

11. The apparatus of claim 10, including a second cooling station accessible by the handler and located out of the path of the handler movement to enable the substrate handler to move a third substrate to the process chamber while the second substrate is in said second cooling station.

12. An apparatus for cooling a substrate after a high temperature processing comprising:

a substrate handling chamber having a port through which the substrate may be moved from the handling chamber into and out of a high temperature process chamber;

an automatic substrate handler in the handling chamber for transporting the substrate into and out of the process chamber; and a first cooling station in which a processed substrate may be moved by said handler to be cooled, said station being located in a section of the handling chamber out of the path of the handler movement to enable a second substrate to be placed in the process chamber while a first substrate is being cooled in the cooling station;

a second cooling station accessible by the handler and located out of the path of the handler movement to enable the substrate handler to move a third substrate to the process chamber while the second substrate is in said second cooling station, wherein one of said cooling stations is located on each side of the port leading to the process chamber.

13. The apparatus of claim 12, wherein the cooling stations are positioned about 100 degrees apart such that the substrate handler only needs to be rotated about 50 degrees from the process chamber port to alignment with one of the cooling stations.

14. The apparatus of claim 12, wherein said substrate handler includes a first end-effector for transfer of the substrates into and out of a storage cassette and includes a second end effector for transferring the substrates among said first end-effector, said cooling stations and said process chamber.

15. An apparatus for cooling substrates after high temperature processing, comprising:

a substrate handling chamber having a port through which the substrates may be moved into and out of a high temperature, single-substrate process chamber;

an automatic substrate handler for transporting the substrates into and out of the process chamber; and a cooling station into which a processed substrate may be moved by said handler to be cooled after removal from the process chamber, said station being located out of the path of the handler movement to enable a second substrate to be placed in the process chamber while the processed substrate is being cooled, said cooling station including upper and lower gas showerheads spaced from each other, and including a support for supporting the processed substrate between the showerheads and spaced from the showerheads, each of said showerheads being adapted to be connected to a source of cooling gas to enable cooling gas to be projected through openings in said showerheads onto an upper surface and a lower surface of the processed substrate to cool the processed substrate, said cooling station being located within and open to said substrate handling chamber.

16. An apparatus for cooling substrates after a high temperature processing, comprising:

a substrate handling chamber having a port through which substrates may be moved between the handling chamber and a high temperature process chamber;

an automatic substrate handler for transporting substrates into and out of the process chamber;

a fixed first cooling station in which a processed substrate may be moved by the handler to be cooled after removal from the process chamber, the station being located out of the path of the handler movement to enable a second substrate to be placed in the process chamber while the processed substrate is being cooled; and a fixed second cooling station accessible by the handler but located out of the path of the handler movement to enable the wafer handler to move the second substrate to the process chamber while the first substrate is in the second cooling station, wherein one of the cooling stations is located on each side of the port leading to the process chamber.

17. The apparatus of claim 16, wherein the cooling stations are positioned about 100° apart such that the wafer handler only needs to be rotated about 50° from the process chamber port to alignment with one of the cooling stations.

* * * * *